United States Patent
Miller et al.

(10) Patent No.: US 7,184,067 B2
(45) Date of Patent: *Feb. 27, 2007

(54) COLOR OLED DISPLAY SYSTEM

(75) Inventors: Michael E. Miller, Rochester, NY (US); Ronald S. Cok, Rochester, NY (US); Andrew D. Arnold, Hilton, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 459 days.

This patent is subject to a terminal disclaimer.

(21) Appl. No.: 10/387,953

(22) Filed: Mar. 13, 2003

(65) Prior Publication Data
US 2004/0178973 A1 Sep. 16, 2004

(51) Int. Cl.
G09G 5/02 (2006.01)

(52) U.S. Cl. .................. 345/696; 345/694; 345/690; 315/169.3

(58) Field of Classification Search ................ 345/211, 345/212, 690, 694, 696, 83, 84; 315/169.3
See application file for complete search history.

(56) References Cited

U.S. PATENT DOCUMENTS

| | | | |
|---|---|---|---|
| 3,813,686 A | 5/1974 | Mierzwinski | |
| 4,800,375 A | 1/1989 | Silverstein et al. | |
| 5,233,385 A | 8/1993 | Sampsell | |
| 5,526,016 A | 6/1996 | Nakagiri et al. | |
| 5,563,621 A | 10/1996 | Silsby | |
| 5,638,084 A | 6/1997 | Kalt | |
| 6,075,514 A | 6/2000 | Ryan | |

(Continued)

FOREIGN PATENT DOCUMENTS

EP 830032 3/2002

(Continued)

OTHER PUBLICATIONS

U.S. Appl. No. 10/320,195, filed Dec. 16, 2002 by Miller et al.

(Continued)

*Primary Examiner*—Kent Chang
(74) *Attorney, Agent, or Firm*—Andrew J. Anderson; Thomas H. Close

(57) ABSTRACT

An OLED display system includes a display device having an array of light emitting pixels, each pixel having a plurality of OLEDs for emitting different colors of light specifying a gamut and at least one additional OLED for emitting a color of light within the gamut, wherein the power efficiency of the additional OLED is higher than the power efficiency of at least one of the plurality of OLEDs; means for generating a control signal indicating an amount of contribution to the light output of the display provided by the additional OLEDs; and a display driver for receiving a standard color image signal representing relative luminance and color to be produced for each pixel of the display and generating a converted color image signal for driving the OLEDs in the display, the display driver being responsive to the control signal for controlling an amount of light produced by the additional OLEDs such that the power efficiency of the display may be increased and/or the rate of degradation of the display device may be decreased.

32 Claims, 8 Drawing Sheets

U.S. PATENT DOCUMENTS

| | | |
|---|---|---|
| 6,133,692 A | 10/2000 | Xu et al. |
| 6,262,710 B1 | 7/2001 | Smith |
| 6,388,644 B1 | 5/2002 | DeZwart et al. |
| 6,411,306 B1 | 6/2002 | Miller et al. |
| 6,483,245 B1 | 11/2002 | Weindorf et al. |
| 6,498,592 B1 | 12/2002 | Matthies |
| 2002/0015110 A1 | 2/2002 | Elliott |
| 2002/0024618 A1 | 2/2002 | Imai |
| 2002/0186214 A1 | 12/2002 | Siwinski |
| 2002/0196208 A1 | 12/2002 | Nano et al. |
| 2003/0103058 A1 | 6/2003 | Elliott et al. |
| 2004/0051724 A1 | 3/2004 | Elliott et al. |
| 2004/0178743 A1 | 9/2004 | Miller et al. |
| 2004/0178974 A1 | 9/2004 | Miller et al. |
| 2004/0195963 A1 | 10/2004 | Choi et al. |
| 2004/0222999 A1 | 11/2004 | Choi et al. |

FOREIGN PATENT DOCUMENTS

| | | |
|---|---|---|
| JP | 10/254386 | 9/1998 |
| JP | 2000/200061 | 7/2000 |
| WO | 00/11728 | 3/2000 |
| WO | 00/70400 | 11/2000 |
| WO | 01/99195 | 12/2001 |

OTHER PUBLICATIONS

Klompenhouwer et al.; "Subpixel Image Scaling For Color Matrix Displays"; SID 02 Digest; pp. 176-179.

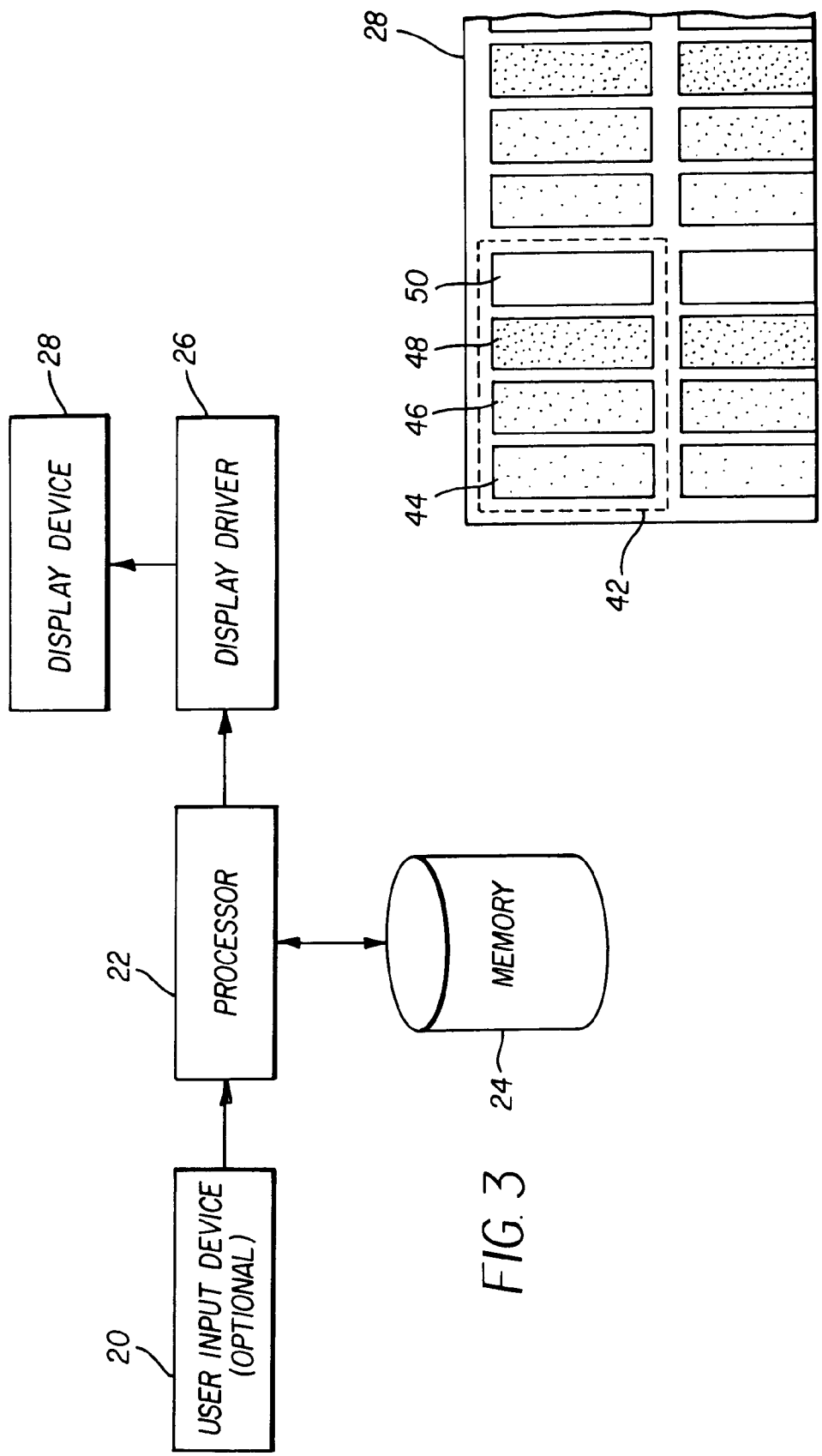

COLOR OLED DISPLAY SYSTEM

FIELD OF THE INVENTION

The present invention relates to organic light emitting diode (OLED), full color display devices and, more particularly, to OLED color displays with improved power efficiency or extended display lifetime.

BACKGROUND OF THE INVENTION

Color, digital image display devices are well known and are based upon a variety of technologies such as cathode ray tubes, liquid crystal and solid-state light emitters such as Organic Light Emitting Diodes (OLEDs). In a common OLED color display device a pixel includes red, green, and blue colored OLEDs. By combining the illumination from each of these three OLEDs in an additive color system, a wide variety of colors can be achieved.

OLEDs may be used to generate color directly using organic materials that are doped to emit energy in desired portions of the electromagnetic spectrum. However, the known red and blue emissive materials are not particularly power efficient. In fact, broad bandwidth (white appearing) materials are known that have power efficiencies that are high enough by comparison to narrow bandwidth materials to produce a comparably power efficient OLED display by placing color filters over a broad bandwidth emissive material. Therefore, it is known in the art to produce OLED displays by building a display using an array of white emitting OLEDs and placing color filters over the OLEDs to achieve red, green and blue light emitting elements in each pixel.

While power efficiency is always desirable, it is particularly desirable in portable applications because an inefficient display limits the time the device can be used before the power source is recharged. In fact, for certain applications the rate of power consumption may be more important than any other display characteristic with the exception of visibility. For this reason, under certain circumstances the end user may wish to reduce the power consumption of a display by making tradeoffs, such as reducing the luminance of the display, which may have the effect of reducing the visibility of the display under high ambient lighting conditions.

Portable applications may also require the display to be used in locations with high ambient illumination. It is known in the art, that an emissive display must be capable of providing higher luminance levels to be seen under high ambient illumination conditions than under lower ambient illumination conditions, and it is also known that these higher luminance levels are necessary to produce both adequate luminance contrast as well as a luminance range that is near the adapted luminance range of the observer. See "The ABC's of Automatic Brightness Control", R. Merrifield and L. D. Silverstein, SID 88 Digest, 1988, pp. 178–180. For this reason, it is known to provide a user with a control to change the luminance of the display in response to changes in ambient illumination conditions. It is also known to automatically adjust the luminance of the display. For example, U.S. Pat. No. 3,813,686, issued May 28, 1974 to Mierzwinski, discusses a control circuit for a cathode ray tube that automatically increases the luminance and chrominance signals to produce a more appealing and useful image under high ambient viewing conditions.

In portable applications, such an automatic circuit allows the display to provide a lower luminance and thus reduced power consumption under low ambient illumination conditions and a higher luminance and thus improved visibility under high ambient illumination conditions. Many enhancements have been discussed for this basic method of adjusting the luminance of a display in response to changes in ambient illumination. For example, U.S. Pat. No. 6,411,306, issued Jun. 25, 2002 to Miller, et al., discusses a method of adjustment for a portable device in which the luminance and contrast of the display are modified in a way which is consistent with human adaptation, that is the luminance of the display is adjusted quickly and in a progressive fashion as the display is moved from a low to a high ambient illuminance environment but the luminance of the display device is adjusted more slowly as the display is moved from a high to a low ambient illuminance environment. However, any previous method that has been used to adjust the luminance of the display has required proportionally more power with increases in display luminance.

In a typical, prior art OLED display, it is know that the luminance of the red, green, and blue OLEDs increase as current density delivered to the OLED is increased. The transfer function from current density to luminance typically behaves according to a linear function as shown in FIG. 1 as known in the prior art. FIG. 1 shows current density to luminance transfer functions for typical red 2, green 4 and blue 6 OLEDs. Therefore, to increase the luminance of the display, one must increase the current delivered to an OLED with a given area. To maintain a color-balanced display, the current must be adjusted differentially to the three OLEDs to maintain the desired ratio of red:green:blue luminance.

Unfortunately, increasing the current density used to drive an OLED not only increases the power required to drive the OLED but also reduces the lifetime of the OLED. FIG. 2 shows typical functions that describe the time required for an OLED to lose half of its luminance as a function of the current density used to drive the OLED. These functions describe the luminance stability over time of the OLEDs as a function of current density. FIG. 2 shows the luminance stability over time of a typical red 8, green 10 and blue 12 OLED. Therefore, increasing the luminance of an OLED display not only increases the power needed to drive the OLED display device but can significantly reduce the lifetime of the OLED display device.

There is, therefore, a need to allow the user to adjust the behavior of a display device to improve power efficiency and/or improve display lifetime while perhaps sacrificing the image quality of the display. There is a further need for a full color OLED display device having improved power efficiency and lifetime when the luminance of the display is adjusted to higher values.

SUMMARY OF THE INVENTION

The need is met according to the present invention by providing an OLED display system that includes a display device having an array of light emitting pixels, each pixel having a plurality of OLEDs for emitting different colors of light specifying a gamut and one or more additional OLEDs for emitting a color of light within the gamut, wherein the power efficiency of the additional OLEDs is higher than the power efficiency of at least one of the plurality of OLEDs; means for generating a control signal indicating an amount of contribution to the light output of the display provided by the additional OLEDs; and a display driver for receiving a standard color image signal representing relative luminance and color to be produced for each pixel of the display and generating a converted color image signal for driving the OLEDs in the display, the display driver being responsive to the control signal for controlling an amount of light produced by the additional OLEDs such that the power efficiency of the display may be increased and/or the rate of degradation of the display device may be decreased.

ADVANTAGES

The advantages of this invention include a color display system that allows the saturation of the display device to be traded for power efficiency. This tradeoff may be made on an absolute basis or as a function of the luminance of the display device.

BRIEF DESCRIPTION OF THE DRAWINGS

FIG. 3 is a diagram illustrating the components of the display system according to one embodiment of the present invention;

FIG. 4 is a schematic diagram illustrating the layout of a series of OLEDs on a display device according to one embodiment of the present invention;

DETAILED DESCRIPTION OF THE INVENTION

Figure 1:
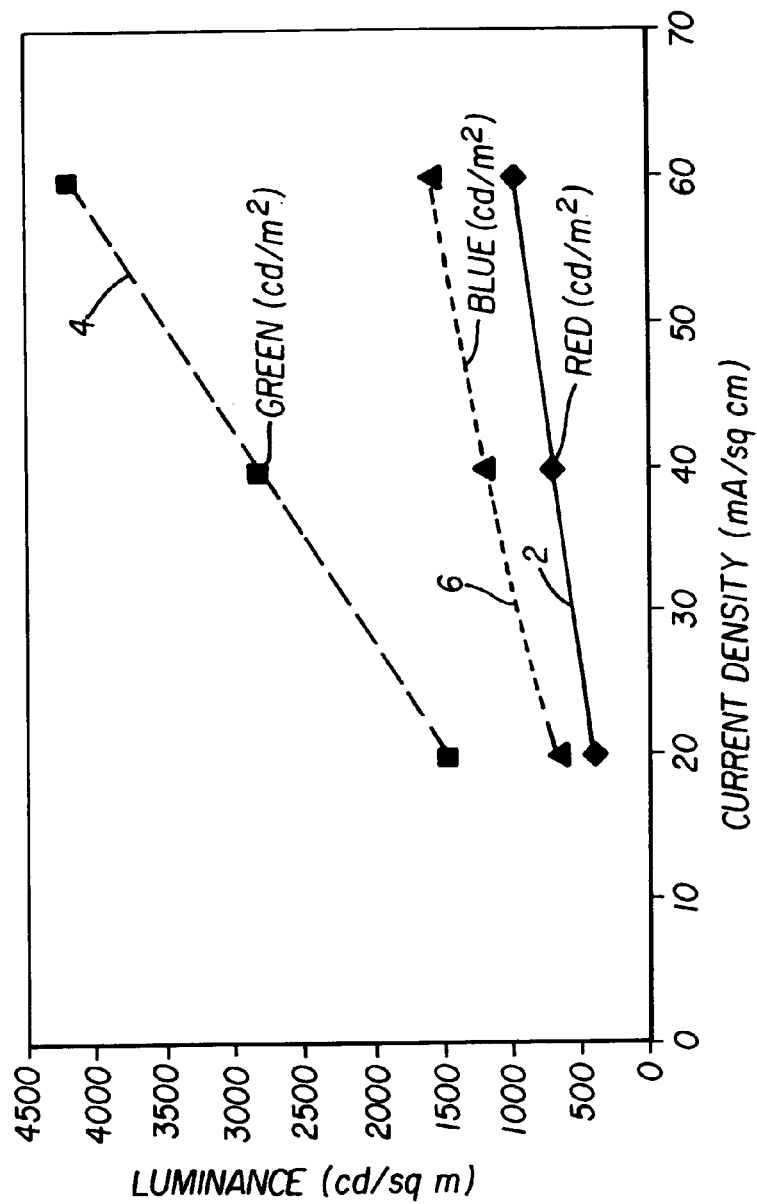
FIG. 1 is a graph showing the relationship of current density to luminance for a typical OLED.

The present invention is directed to a display system comprising an OLED display device, a means for driving the OLED display device, and a means for changing the driving means in response to a control signal. More particularly, the present invention is directed to display systems that include a full color display device having three or more emissive OLEDs, providing three or more primary colors that define the gamut of the display device, with one or more additional OLEDs having a color that is inside the gamut of the display device and also having a higher power efficiency and/or luminance stability over time than the OLEDs that describe the gamut of the display device. In this invention, a signal processor associated with the display device converts a standard three-color image signal to drive signals that drive the emissive OLEDs in a way that is dependent on the control signal.

This conversion is accomplished such that the power usage is minimized without any loss of saturation for some control signals. Where the term "saturation" refers to color saturation (i.e. the purity of a color produced by the display device). However, for some control signals the conversion is implemented such that the saturation of colors shown on the display device is reduced in a way that increases the power efficiency of the display and/or decreases the rate of degradation of the display device.

The control signal will typically be dependent upon user settings, a state of the display system and/or a measurement of ambient illumination. This control signal will preferably be generated from an interactive user control, a sensed signal and/or a means for automatically detecting ambient illumination. When ambient illumination is sensed the display system may additionally adjust the luminance of the display to maintain display visibility under the appropriate ambient illumination conditions. By allowing the conversion to be dependent on user settings, the user is given the ability to trade color saturation for power efficiency. This conversion may additionally be dependent upon the luminance of the display. By allowing the conversion to be dependent on a control signal that is used to derive the target luminance value of the display, the conversion may provide fully or nearly fully saturated colors for a broad range of luminance values. However, the display system may change the conversion to provide higher utilization of OLEDs with higher power efficiency and/or luminance stability over time for other luminance values. By doing this, conditions that may demand excessive power or may cause an unacceptable degradation of the display device may be avoided by providing colors with lower saturation.

It is recognized that while the present invention is disclosed for a display system that employs a full color OLED display device, this same technique may be applied to any full color emissive display device having three or more emissive elements, providing three or more primary colors that define the gamut of the display device, with one or more additional emissive elements having a color that is inside the gamut of the display device and also having a higher power efficiency and/or luminance stability over time than one or more of the emissive elements that describe the gamut of the display device.

An embodiment of this invention is shown in FIGS. 3 and 4. Referring to FIG. 3, the system includes an input device 20, processor 22, memory 24, display driver 26 and display device 28. The input device 20 may include any traditional input device including a joystick, trackball, mouse, rotating dial, switch, button or graphic user interface that may be used to select among two or more options from a series of user options. The processor 22 is any, or combination of any, digital or analog, general purpose or custom processor(s) capable of performing the logic and calculation steps necessary to perform the steps of this invention. The memory 24 is ideally non-volatile, writable memory that can be used to store user selections including EPROMS, EEPROMS, memory cards, or magnetic or optical discs.

The display driver 26 is one or more analog or digital signal processors capable of receiving a standard three-color image signal and converting this signal to a drive signal with four or more color image signals that are compatible with the display device of the present invention. This display driver is additionally capable of receiving a control signal from the processor and adjusting the conversion process in response to this control signal.

The display device 28 is an OLED display device having an array of pixels, each pixel having OLEDs for providing three or more primary colors that define the gamut of the display device, and including one or more additional OLEDs emitting a color that is inside the gamut of the display device and also having a higher power efficiency than the OLEDs that describe the gamut of the display device. An appropriate OLED display device has been discussed in a co-pending application, U.S. Ser. No. 10/320,195 filed Dec. 16, 2002 by Miller, et al. which is incorporated herein by reference. A display device with a preferred pixel arrangement is shown in FIG. 4.

Figure 5:
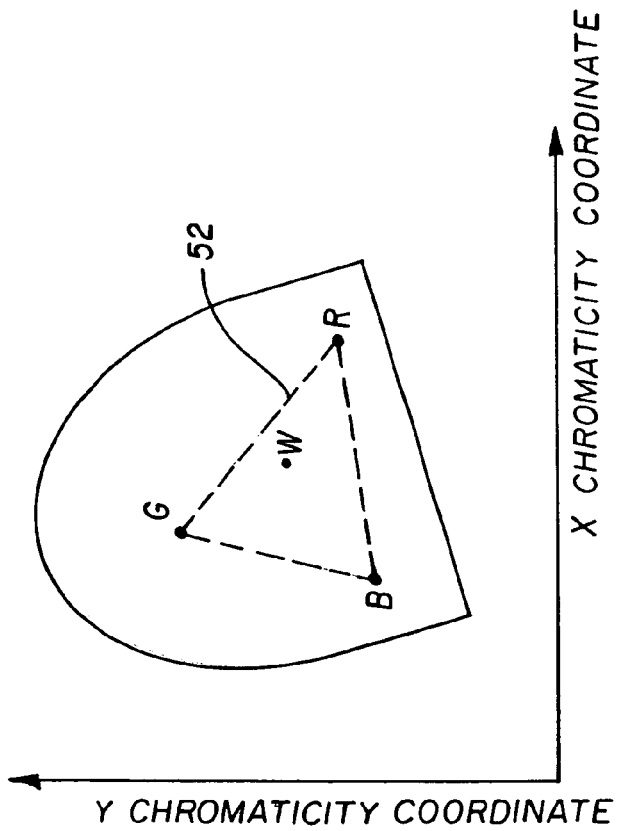
FIG. 5 is a CIE chromaticity diagram showing gamut formed chromaticity coordinates of red, green and blue OLEDs and a chromaticity coordinate of a white OLED inside the gamut.

FIG. 4 shows a display device 28, that is composed of a number of pixels 42. Each pixel 42 in this display device 28 is composed of four OLEDs. Three OLEDs that emit red 44, green 46, and blue 48 light define the gamut of the display device. An additional OLED 50 emits light that is substantially white in color and has a chromaticity coordinate that is inside the gamut defined by the chromaticity coordinates of the red 44, green 46 and blue 48 OLEDs. FIG. 5 is a standard CIE chromaticity diagram showing a color gamut 52 formed by the chromaticity coordinates of the red, green and blue (R,G,B) OLEDs and the chromaticity coordinate of a white (W) OLED that is inside the gamut 52.

Figure 6:
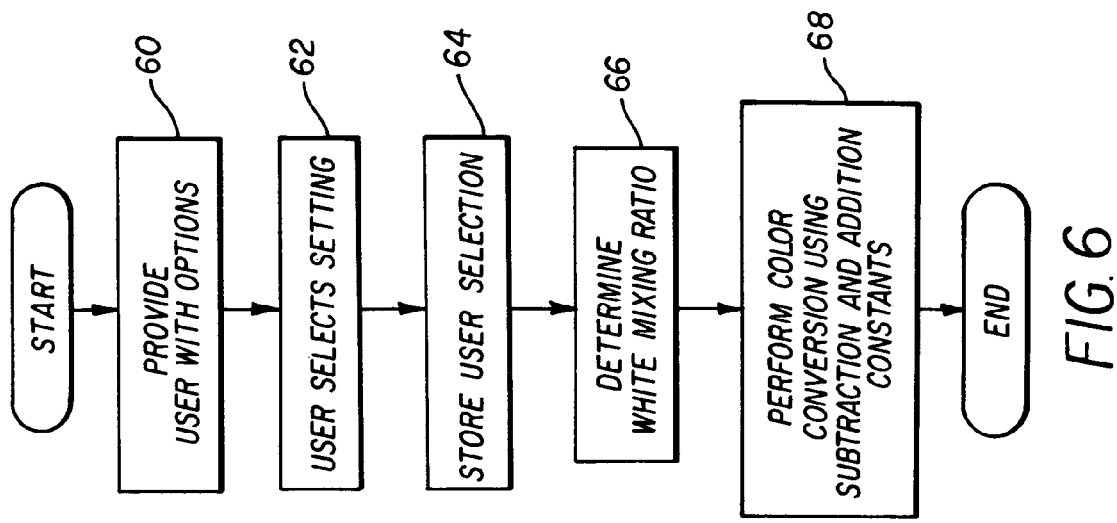
FIG. 6 is a flow chart illustrating the general process employed by the system to determine an appropriate subtraction and addition constants.
Figure 7:
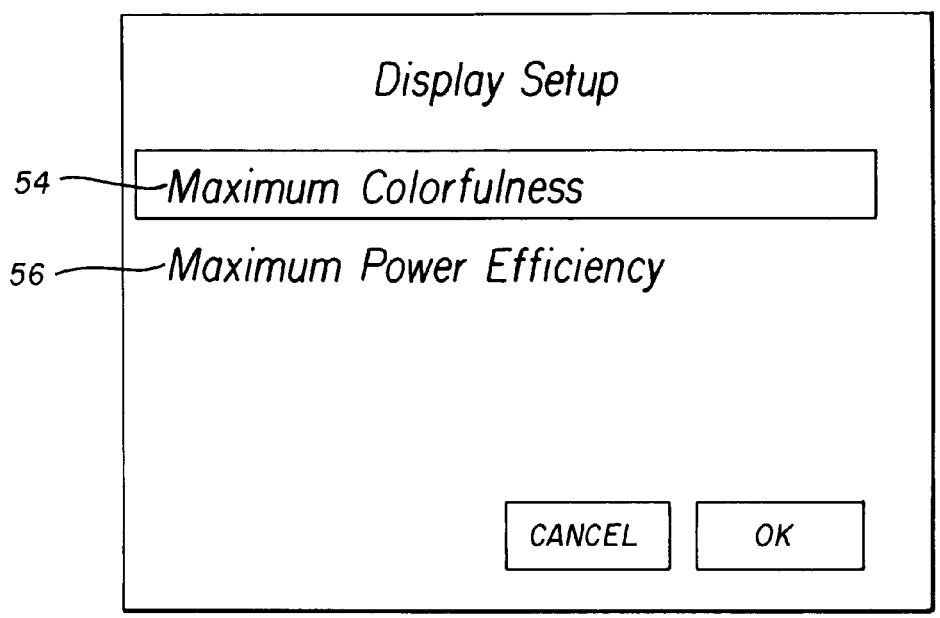
FIG. 7 is a diagram illustrating a user interface that allows the user to tradeoff power efficiency for color saturation.

FIG. 6 shows a process that may be employed to practice this invention. A user is provided 60 with the option to select among different settings for the display device, allowing her to tradeoff power efficiency for color saturation. To accomplish this, a menu of possible alternatives may be displayed to the user as shown in FIG. 7. The alternatives can include, for example, "maximum colorfulness" 54 allowing colors to be fully saturated, or maximum power efficiency 56 allowing the maximum use of the white OLEDs at the expense of color saturation in an image. Alternatively, a "slider" can be provided in the graphic user interface to allow the user to select a continuous level of trade off between saturation and power usage. This user interface allows the user to select 62 among options that include different combinations of saturation and power efficiency. When the user selects 62 their preferred setup, the processor 22 stores 64 the user selection into memory 24 for future reference. The processor 22 then determines 66 the appropriate ratio of luminance required from the one or more additional OLEDs to the luminance required from the three or more OLEDs of the display device. In this embodiment, the subtraction (F1) and addition (F2) constants for this user selection are determined 66 by referencing a look up table from memory 24. The processor 22 then uses these values to perform 68 a conversion from a standard three-color image signal to drive signals that drive the OLEDs.

Figure 8:
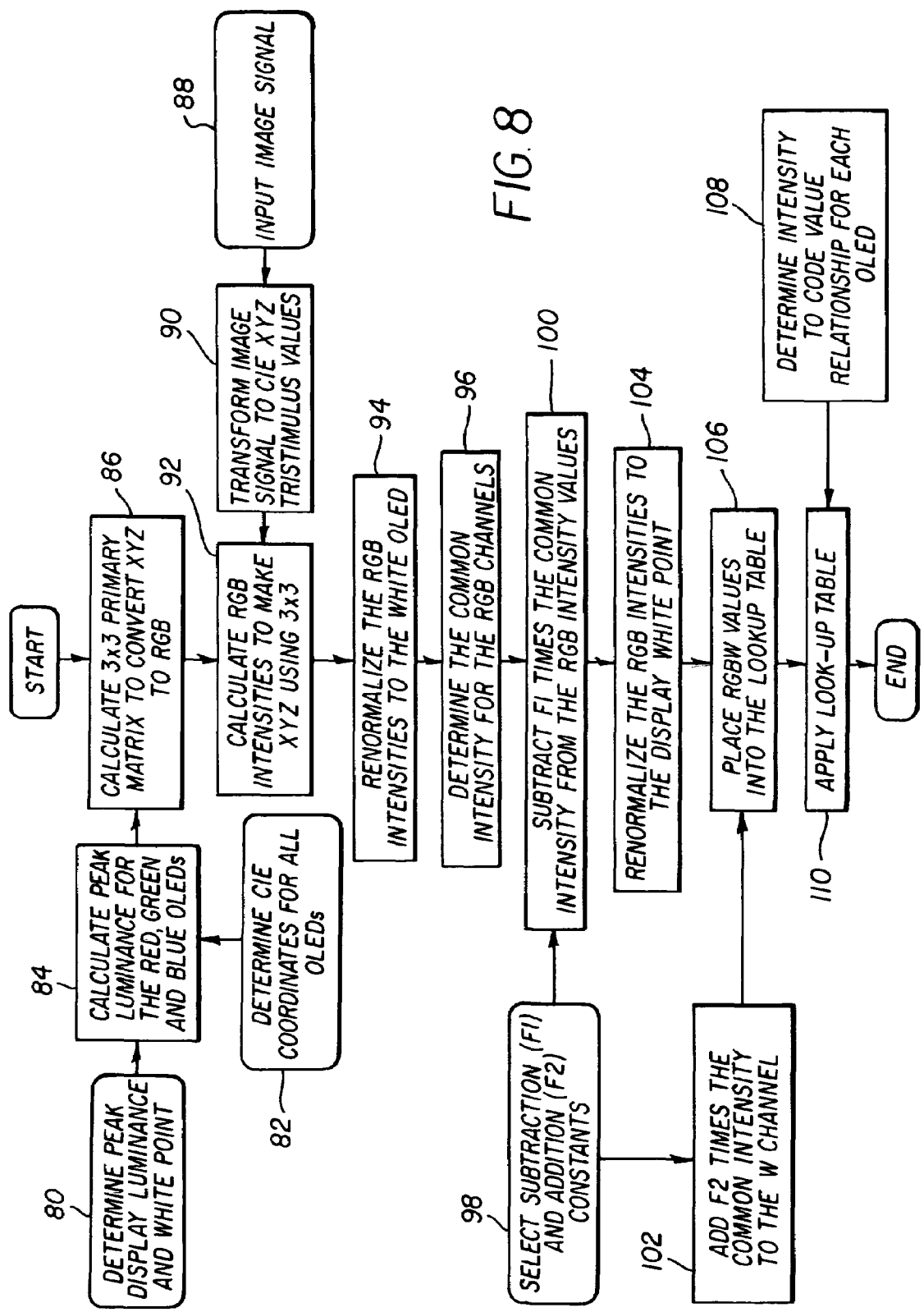
FIG. 8 is a flow chart illustrating one method for converting from a standard three color signal to drive a 4 or more color display in a way that depends on subtraction and addition constants.

While a three-color signal may be converted to a four color signal appropriate for driving the display device using a number of different processes, one exemplary process for performing the conversion from a standard three-color image signal to a four-color signal appropriate to drive the display device in the preferred embodiment is depicted in FIG. 8. When using this method, the addition constant (F2) is typically constrained to values equal to or higher than the subtraction constant (F1). In this way, luminance that is removed from the red, green, and blue OLEDs are replaced by the in-gamut, more power efficient OLED. Higher values for the subtraction constant will then result in higher average power efficiencies (i.e., lower power use) for the display. However, the subtraction constant (F1) is constrained to a maximum value of 1.0 while the addition constant may be larger than 1.0. When using this process, anytime the addition constant is larger than the subtraction constant, a loss of color saturation will occur. It should also be noted that anytime the addition constant is larger than the subtraction constant the luminance output of the display will be increased and therefore the effective peak luminance will be equal to the ratio of the addition constant to the subtraction constant multiplied by the desired peak luminance for the display.

Using the approach depicted in FIG. 8, the desired peak luminance and chromaticity coordinates of the display white point are determined 80. The CIE chromaticity coordinates for each OLED are then determined 82. Using these values, the peak luminance is calculated 84 for the red 44, green 46, and blue 48, OLEDs using the following equations:

$$Y_r = \frac{y_r(x_w(-y_b + y_g) + x_g(y_b - y_w) + x_b(-y_g + y_w))Y_w}{(x_g y_b - x_r y_b - x_b y_g + x_r y_g + x_b y_r - x_g y_r) y_w} \quad (1)$$

$$Y_g = \frac{y_g(x_w(y_b - y_r) + x_b(y_r - y_w) + x_r(-y_b + y_w))Y_w}{(x_g y_b - x_r y_b - x_b y_g + x_r y_g + x_b y_r - x_g y_r) y_w} \quad (2)$$

$$Y_b = \frac{y_b(x_w(-y_g + y_r) + x_r(y_g - y_w) + x_g(-y_r + y_w))Y_w}{(x_g y_b - x_r y_b - x_b y_g + x_r y_g + x_b y_r - x_g y_r) y_w} \quad (3)$$

where: $Y_w$ represents the desired peak luminance (i.e., the luminance of the final display device when the display device is turned on to its maximum value); $x_w$ and $y_w$ represent the chromaticity coordinates of the desired display white point; $Y_r$, $Y_g$, and $Y_b$ represent the peak luminance values required for the display device to produce the desired white luminance; $x_r$, $x_g$, and $x_b$ represent the respective x chromaticity coordinates of the red, green, and blue OLEDs in the display device; and $y_r$, $y_g$, and $y_b$ represent the respective y chromaticity coordinates of the red, green, and blue OLEDs in the display device.

Using this data and the desired peak luminance for the red, green and blue display device luminance, a 3×3 matrix is calculated 86. This 3×3 matrix is commonly referred to as the "phosphor matrix" of the display and can be used to convert CIE XYZ tristimulus values to red, green, and blue intensity values. The intensity of a primary is herein defined as a value proportional to the luminance of that primary and scaled such that the combination of unit intensity of each of the three primaries produces a color stimulus having XYZ tristimulus values equal to those of the display white point. The standard-three color image signal is then input 88 and, if necessary, converted 90 to aim CIE XYZ tristimulus values. For example, if the input is sRGB, the non-linear encoding is removed by applying a look-up table and then XYZ tristimulus values are calculated by applying a 3×3 matrix. Red, green, and blue intensity values are then calculated 92 using the 3×3 matrix that was calculated 86 earlier to rotate from the primaries associated with CIE XYZ tristimulus values to the red, green, and blue intensity values of the display device. These intensity values are renormalized from the white point of the display to the peak luminance of the white OLED 94, and the common intensity, i.e., the minimum of the three, is determined 96. Subtraction (F1) and addition (F2) constants are then selected 98 as described in step 66 of FIG. 8.

The subtraction constant (F1) is multiplied by the common intensity and is subtracted 100 from each of the red, green, and blue intensity values that were determined 96 earlier. The addition constant (F2) multiplied by the common intensity is then added 102 to the intensity of the white OLED, which starts out as zero. The intensity values for the red, green, and blue OLEDs are renormalized 104 to the display white point, and combined 106 with the intensity value for the white OLED. A lookup table to convert from intensity of the red, green, blue and white OLED to the code value required to produce each intensity is then determined 108. This lookup table is then applied to determine 110 the code values necessary to drive each OLED to its desired intensity.

Figure 2:
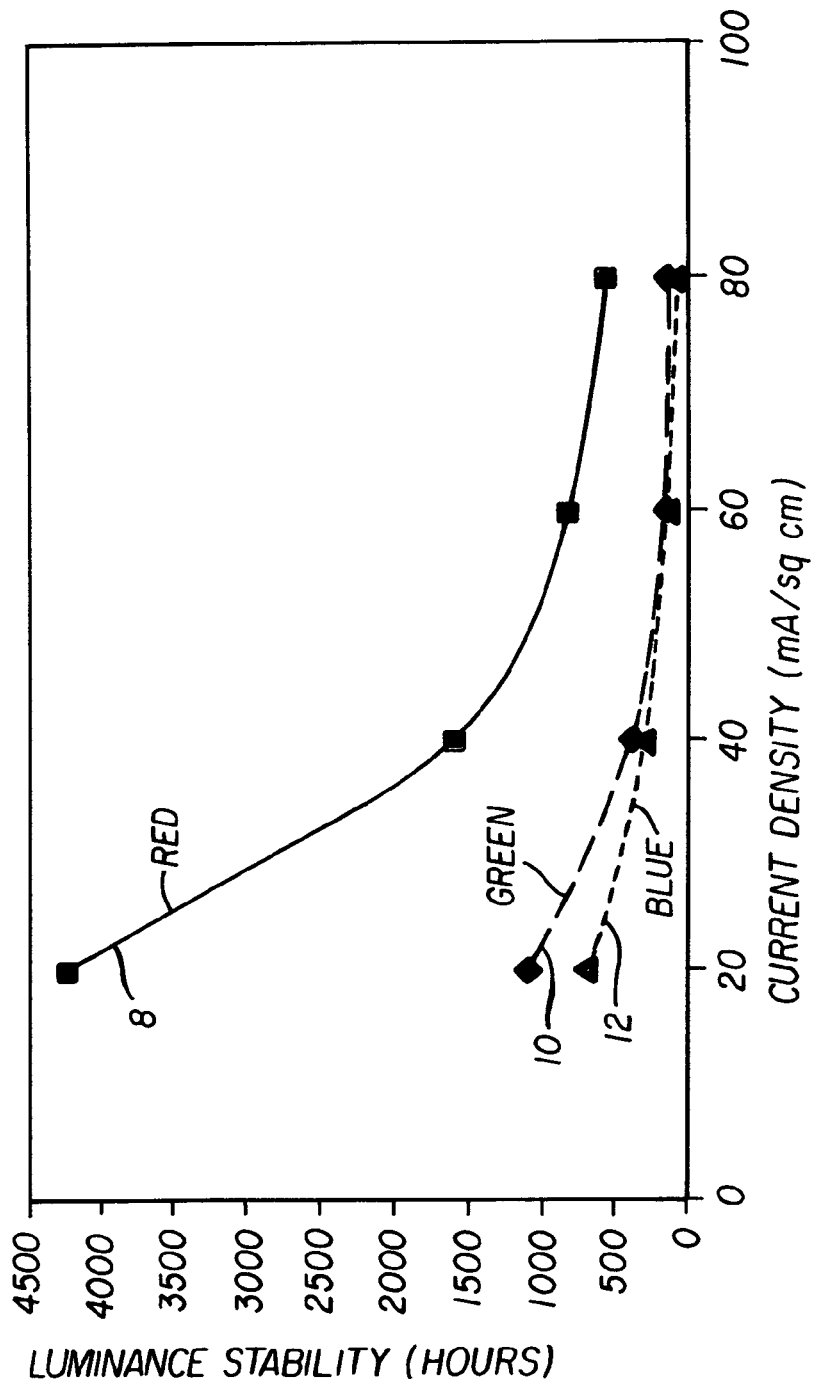
FIG. 2 is a graph showing the relationship of current density to the luminance stability over time of a typical OLED.

It should also be noted that this conversion process may be further modified to not only reduce power but to help maintain display lifetime. As shown in FIG. 2, OLED luminance stability, when defined as the number of hours required for an OLED to reach half of its initial luminance, is highly dependent upon the drive current. Therefore, if it is determined that the display must perform for a minimum number of hours, e.g., 500, one can use a graph such as FIG. 2 to determine the maximum current density that the OLED can be driven to meet this criteria. Using this criteria, one can see that the blue light emitting OLED can only be driven at a current density of 20 mA/sq. cm while the green and red light emitting OLEDs can be driven at current densities around 35 and 80 mA/sq. cm, respectively. White emitting materials are known that perform very well using this criteria and can be driven at or even well beyond 80 mA/sq m using this criteria. Using this value and a mathematical relationship relating current density to luminance of a display device, one can determine the maximum luminance that can be achieved for any color light emitting OLED that will not exceed the maximum current density for the appropriate OLED. Therefore, a step may be inserted after step 106 where the maximum intensity is subtracted from any values higher than this maximum and the remainder is added to the white light emitting OLED. In this way, the color saturation may be reduced for that one color. Note that this transformation differs from increasing the subtraction and addition constants as the use of addition constants larger than the subtraction constant reduces the saturation of all colors while the transformation discussed here reduces only the saturation of only colors that require more luminance to be produced than can be produced by the primary pixel. It should be noted that it is possible that the luminance required from the white light emitting OLED may also reach a maximum value in which case, this luminance may be redistributed to the color light emitting OLEDs using a similar approach.

By providing a conversion process, such as the one described here, within the system that is provided, the user is able to interactively adjust the subtraction (F1) and addition (F2) constants of the display. This capability effectively allows the user to modify the power usage of the display for a given display brightness by allocating the amount of luminance to be generated by the display away from less power efficient OLEDs and towards more power efficient OLEDs. The penalty the user pays is loss of color saturation when the addition constant is set to a higher value than the subtraction constant. Therefore, this system allows the user to trade power efficiency for color saturation.

It should be noted that within this embodiment, the tradeoff of power efficiency for color saturation is made intentionally by the user. However, the same tradeoff may be initiated by other events. For example, the user interface may provide a control, such as a brightness control for the display. And the system may decide to apply one pair of subtraction and addition constants for one range of luminance values and a second pair of subtraction and addition constants for a second range of luminance values. Alternatively, a system may be able to detect the power level of a battery and increase the subtraction and addition constants, such that the display draws less power when the available battery power level reaches some threshold. The same tradeoff may further be made when the system detects lack of user interest or responsiveness. For example when a certain amount of time passes without user interaction, the system may begin to enter a power saving mode by increasing the subtraction and addition constants. In this example, increasing the subtraction and addition constants significantly, reduces the power consumption of the display device, provides the user a visible indication that the state of the system has changed, and allows the user to see and interact with the display without waiting for the display to increase its power usage and luminance.

Figure 9:
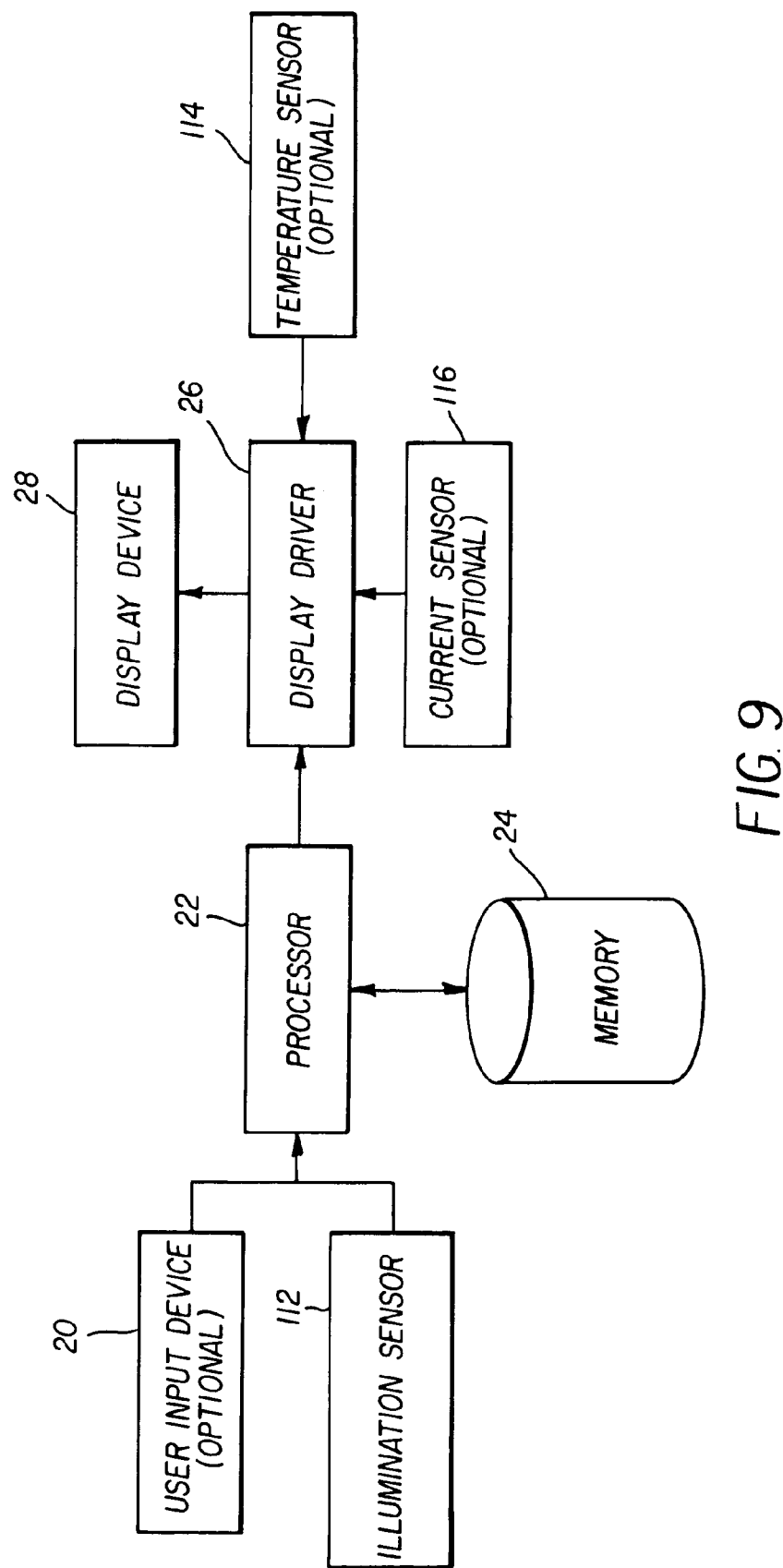
FIG. 9 is a diagram illustrating the components of the display system according to one embodiment of the present invention.

In another embodiment, the subtraction and addition constants may be adjusted in a more continuous way. A particularly interesting embodiment is a display system that employs an automatic method for determining ambient illumination, adjusts the brightness of the display in response, and adjusts the subtraction and addition constants in response to the display luminance in a way that makes the loss of saturation appear at a slow enough rate that the change is not readily apparent to the user, while at the same time improving the power efficiency of the display device and/or improving the lifetime of the display under high display luminance conditions. Such a system is shown in FIG. 9.

As discussed in the previous embodiment, this display system includes a processor 22, memory 24, display driver 26 and a display device 28. The system also includes a user input device 20, which is used to adjust a gain value for the display brightness as described below. Additionally the system may include an ambient illumination sensor 112 such as a photodiode or other sensor that is used to measure the amount of ambient illuminance in the environment that falls on or near the display. As discussed later, the system may also include other sensors, such as an optional temperature sensor 114 or current sensor 116. The temperature sensor 114 may be placed on the back of the display and is used to measure the temperature of the display device. The current sensor 116 may be used to measure the current being drawn by the display device.

Figure 10:
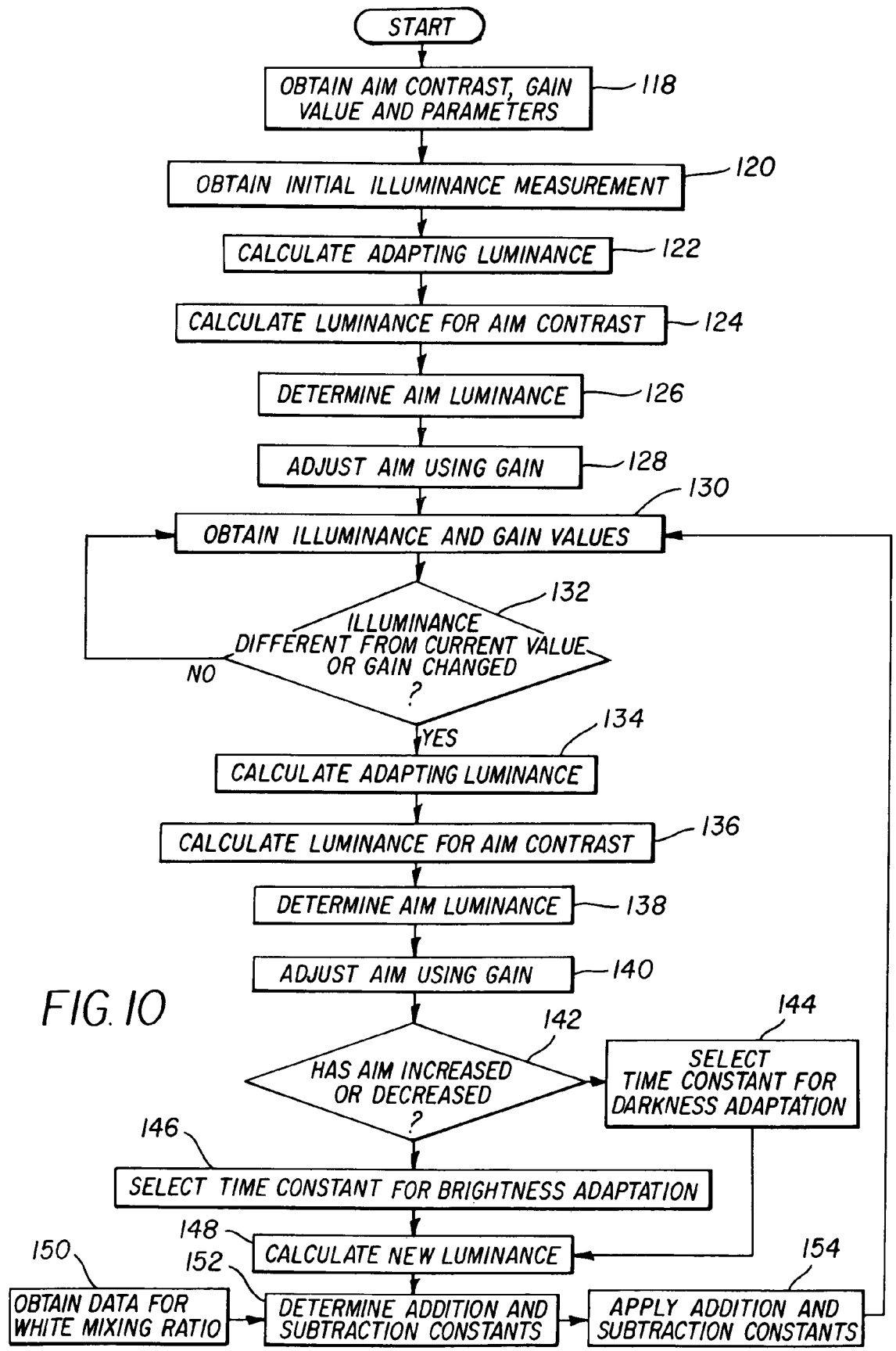
FIG. 10 is a flow chart illustrating a method for determining subtraction and addition constants based upon a measurement of the ambient illuminance level.

The method used to adjust the subtraction and addition constants within this system is shown in FIG. 10. As shown in FIG. 10, on power up, aim contrast, gain values and additional parameters are obtained 118. An initial ambient illuminance is then measured 120 using the ambient illumination sensor 112. The adapting luminance is then calculated 122 for the current ambient illumination level. This calculation is used to determine the minimum brightness that is required for the display to be viewed given the adaptation state of the user. This calculation is performed using the equation:

$$L_a = 10^{(a+b\ log(I))} \quad (4)$$

Where $L_a$ is the adapting luminance, I is the ambient illuminance value and a and b are constants that are fit to psychophysical data.

Once the adapting luminance is calculated 122, the luminance required to obtain the aim display contrast is calculated 124. This calculation is performed to account for the fact that the ambient illuminance is reflected from the display, affecting the luminance of the background and foreground luminance. This value is calculated from the equation:

$$L_c = cL_b + (c-1)\left(\frac{IR}{\pi}\right) \quad (5)$$

where $L_c$ represents the luminance required to achieve the desired contrast, c represents the desired contrast ratio of the white to the black luminance (typically a value greater than 3), $L_b$ represents the minimum emitted display luminance (typically 0 for an OLED display device), I is the ambient illuminance, R is the reflectance of the display, and $\pi$ is the constant pi.

The initial aim luminance is determined 126 by taking the maximum of the adapting luminance, the luminance required to obtain the aim display contrast and any minimum luminance constraint that may exist in the parameter set obtained 118 earlier. The gain value, which is typically a value between 0.5 and 2.0, is then used to adjust 128 the initial aim luminance value through multiplication.

New ambient illuminance and gain values are obtained 130 by obtaining an ambient illuminance measurement from the ambient illumination sensor 112 and by determining any change in the gain value from any change in the state of the user input device 20. These new values are compared 132 to the initial values. If no change has taken place, new readings of ambient illuminance and gain are obtained 130 and compared 132 again. If a change in ambient illuminance or gain occurs, the adapting luminance is calculated 134 using the new ambient illuminance value and the same equations used to calculate 122 the initial adapting luminance. A new luminance needed to obtain the necessary contrast is calculated 136 using the same equations as described for step 124. A new aim luminance is determined 138 using the same calculation described for step 126. Finally this value is adjusted 140 by the new gain value as described for step 128.

A step 142 is then performed to determine if the aim luminance has increased or decreased. If the aim luminance has decreased, a time constant is selected 144 that is appropriate for dark adaptation, otherwise a time constant is selected 146 that is appropriate for light adaptation. It should be noted that since human light adaptation occurs much more quickly than dark adaptation, the time constant for light adaptation is typically higher than for dark adaptation.

The new luminance is then calculated 148 and stored as the new initial luminance. This calculation 148 is performed by adding a proportion of the change in luminance to the current luminance using an equation of the form:

$$L = L_i + \frac{La - Li}{t} \quad (6)$$

where L is the new luminance, $L_i$ is the initial luminance, $L_a$ is the adjusted aim luminance calculated 140 earlier, and t is the time constant selected in step 144 or 146 above.

A formula or look up table for determining subtraction and addition constants as a function of display luminance values are then obtained 150. Using the new display luminance calculated 148 earlier and the formula or look-up-table that is obtained 150, the new subtraction and addition constants are determined 152 and applied 154 within the conversion process shown in FIG. 7.

Using this process, the subtraction and addition constants can be changed gradually as the luminance of the display is adapted to the viewing environment. Since the occurrence of dramatic changes in ambient illumination are rare and the rate at which the brightness of the display is changed is slowed by the time constants that are employed, it is unlikely that the individual changes in subtraction and addition constants will be large using this process. Therefore, while the display will gain and lose saturation, especially when moved between very low ambient illuminance and very high ambient illuminance environments, it is unlikely that the user will see this change. However, since the subtraction and addition constants will generally be increased with increases in display luminance, the power efficiency and lifetime of the OLEDs that compose the display will be improved.

It should be noted that similar continuous changes in subtraction and addition constants may be employed as a function of any other continuous control signal. These may include but are not limited to the available power in the power supply of the portable device, a manually determined display luminance value, the total current needed to drive the display device as sensed using the optional current sensor 116 or the temperature of the display device determined from a temperature sensor 118 placed in or near the display device.

It should be noted that while the particular embodiments discussed herein are discussed particularly for a display device having three OLEDs that define the gamut boundary of the display and one additional OLED that has a higher power efficiency and lifetime but has color coordinates that are within the gamut of the display device, these same concepts may be employed in a similar display device having more than three OLEDs that define the gamut.

Additionally, these same concepts may apply to a display device having more than one additional OLED with a higher power efficiency. However, in the latter case, another pair of subtraction and addition constants may exist for each different color OLED that is within the gamut of the display device. Each of these pairs of subtraction and addition constants may be assigned the same or different values in a fashion as described within these preferred embodiments.

The invention has been described in detail with particular reference to certain preferred embodiments thereof, but it will be understood that variations and modifications can be effected within the spirit and scope of the invention.

PART LIST 2 luminance transfer function for red OLED
4 luminance transfer function for green OLED
6 luminance transfer function for blue OLED
8 stability curve for red OLED
10 stability curve for green OLED
12 stability curve for blue OLED
20 input device
22 processor
24 memory
26 display driver
28 display device
42 pixel
44 red OLED
46 green OLED
48 blue OLED
50 white OLED
52 color gamut
54 maximum colorfulness selection
56 maximum power efficiency selection
60 provide user with option step
62 user selection step 64 store user selection in memory step
66 determine subtraction and addition constants step
68 perform conversion step
80 determine display white point step
82 determine chromaticity coordinates of OLEDs step
84 calculate peak luminances step
86 calculate primary matrix step
88 input three color image signal step
90 convert to CIE XYZ values step
92 calculate red, green and blue intensity values step
94 renormalize intensity values step
96 determine common intensity value step
98 select addition and subtraction constant step
100 subtract common intensity step
102 add common intensity step
104 renormalize luminance values step
106 place red, green, blue and white luminance values in a matrix step
108 determine code value step
110 apply lookup table step
112 ambient illumination sensor
114 temperature sensor
116 current sensor
118 obtain parameters step
120 measure ambient illuminance step
122 calculate adapting illuminance step
124 calculate luminance step
126 determine aim luminance step
128 adjust gain value step
130 obtain new values step
132 compare new values step
134 calculate adapting luminance step
136 calculate new luminance step
138 determine new aim luminance step
140 adjust luminance value step
142 determine increase or decrease step
144 select dark adaptation time constant step
146 select light adaptation time constant step
148 calculate new luminance step
150 obtain formula step
152 determine subtraction and addition constants step
154 apply subtraction and addition constants step

What is claimed is:

1. An OLED display system, comprising:
 a) a display device including an array of light emitting pixels, each pixel having a plurality of OLEDs for emitting different colors of light specifying a gamut and at least one additional OLED for emitting a color of light within the gamut, wherein the power efficiency of the additional OLED is higher than the power efficiency of at least one of the plurality of OLEDs;
 b) means for generating a control signal indicating an amount of contribution to the light output of the display provided by the additional OLEDs; and
 c) a display driver for receiving a standard color image signal representing a relative luminance and color to be produced for each pixel of the display and generating a converted color image signal for driving the plurality of OLEDs emitting different colors of light specifying a gamut in combination with the additional OLEDs emitting a color of light within the gamut in the display, the display driver being responsive to the control signal for controlling an amount of light produced by the additional OLEDs when displaying the converted color image signal such that the power efficiency of the display may be increased and/or the rate of degradation of the display device may be decreased.

2. The OLED display system claimed in claim 1, wherein the means for generating a control signal also indicates a reduction in the amount of light output of the display provided by the plurality of OLEDs for emitting different colors of light specifying a gamut.

3. The OLED display system claimed in claim 1, wherein the means for generating the control signal is a photosensor responsive to ambient illumination, and wherein the display driver controls the luminance and the saturation of the colors of the display in proportion to the ambient illumination to provide higher luminance and reduced saturation at higher ambient illumination levels.

4. The OLED display system claimed in claim 3, wherein the display driver includes a damping constant to prevent rapid changes in luminance and saturation of a display produced by the display device.

5. The OLED display system claimed in claim 4, wherein the damping constant is greater for decreasing ambient illumination and smaller for increasing ambient illumination.

6. The OLED display system claimed in claim 3, wherein the display controller further changes the contrast of the display in response to the ambient illumination level.

7. The OLED display system claimed in claim 1, wherein the means for generating a control signal is a user interface control.

8. The OLED display system claimed in claim 7, wherein the user interface control allows a user to select a tradeoff between power usage and color saturation of the display.

9. The OLED display system claimed in claim 3, further comprising a user interface to the display driver that allows a user to select a level of tradeoff between power usage and color saturation of the display.

10. The OLED display system claimed in claim 1, further comprising means for user interaction and means for causing the control signal to indicate a predetermined amount of contribution by the additional OLEDs in the absence of user interaction for a predetermined time, whereby power is saved without turning off the display.

11. The OLED display system claimed in claim 1, wherein the display is powered by a battery and wherein the control signal is correlated to an amount of power remaining in the battery.

12. The OLED display system claimed in claim 1, wherein the means for generating a control signal includes a current sensor and the control signal is proportional to the total current being drawn by the display device.

13. The OLED display system claimed in claim 1, wherein the means for generating a control signal includes a temperature sensor and the control signal is correlated to the temperature of the display device.

14. The OLED display system claimed in claim 1, wherein the display driver limits the level of the converted color image signal applied to the additional OLED to some maximum value.

15. The OLED display system claimed in claim 1, wherein the OLED display device includes OLEDs having materials that emit different colors of light.

16. The OLED display system claimed in claim 1, wherein the OLED display device includes OLEDs that emit a broad spectrum of light and are overlaid with color filters.

17. A method of driving an OLED display, comprising the steps of:
 a) providing a display device including an array of light emitting pixels, each pixel having a plurality of OLEDs for emitting different colors of light specifying a gamut and an additional OLED for emitting a color of light within the gamut, wherein the power efficiency of the additional OLED is higher than the power efficiency of at least one of the plurality of OLEDs;

b) generating a control signal indicating an amount of contribution to the light output of the display provided by the additional OLEDs;

c) receiving a standard color image signal representing a relative luminance and color to be produced for each pixel of the display and generating a converted color image signal for driving the plurality of OLEDs emitting different colors of light specifying a gamut in combination with the additional OLEDs emitting a color of light within the gamut in response to the control signal to control an amount of light produced by the additional OLEDs when displaying the converted color image signal such that the power efficiency of the display may be increased and/or the rate of degradation of the display device may be decreased; and d) driving the display device with the converted color image signal.

18. The method claimed in claim 17, wherein the step of generating a control signal also indicates a reduction in the amount of light output of the display provided by the plurality of OLEDs for emitting different colors of light specifying a gamut.

19. The method claimed in claim 1, wherein the control signal is proportional to ambient illumination, and wherein the converted color image signal is generated such that the luminance and the saturation of the colors of the display are in proportion to the ambient illumination to provide higher luminance and reduced saturation at higher ambient illumination levels.

20. The method claimed in claim 19, wherein the converted color image signals are generated so as to prevent rapid changes in luminance and saturation of a display produced by the display device.

21. The method claimed in claim 20, wherein the rate of change in brightness and saturation is greater for decreasing ambient illumination and smaller for increasing ambient illumination.

22. The method claimed in claim 19, wherein the converted color image signals are generated to change the contrast of the display in response to the ambient illumination level.

23. The method claimed in claim 17, wherein the control signal is generated by a user.

24. The method claimed in claim 23, wherein the user generated the control signal to select a tradeoff between power usage and color saturation of the display.

25. The method claimed in claim 19, further comprising the step of selecting a level of tradeoff between power usage and color saturation of the display and generating the converted color image signals in response to the selection.

26. The method claimed in claim 17, further comprising the step of causing the control signal to indicate a predetermined amount of contribution by the additional OLEDs in the absence of user interaction for a predetermined time, whereby power is saved without turning off the display.

27. The method claimed in claim 17, wherein the display is powered by a battery and wherein the control signal is correlated to an amount of power remaining in the battery.

28. The method claimed in claim 17, wherein the control signal is proportional to the total current being drawn by the display device.

29. The method claimed in claim 17, wherein the control signal is correlated to the temperature of the display device.

30. The method claimed in claim 17, wherein the level of the converted color image signal applied to the additional OLED is limited to some maximum value.

31. The method claimed in claim 17, wherein the OLED display device includes OLEDs having materials that emit different colors of light.

32. The method claimed in claim 17, wherein the OLED display device includes OLEDs that emit a broad spectrum of light and are overlaid with color filters.

* * * * *